United States Patent
Wang et al.

(10) Patent No.: US 6,277,742 B1
(45) Date of Patent: Aug. 21, 2001

(54) METHOD OF PROTECTING TUNGSTEN PLUG FROM CORRODING

(75) Inventors: Chien-Jung Wang, Hsinchu; Chingfu Lin; Lien-Jung Hung, both of Taipei, all of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/342,570

(22) Filed: Jun. 29, 1999

(30) Foreign Application Priority Data

Apr. 5, 1999 (TW) .................................................. 88107216

(51) Int. Cl.[7] ...................... H01L 21/44; H01L 21/4763; H01L 21/302; H01L 21/461
(52) U.S. Cl. ......................... 438/672; 438/622; 438/648; 438/656; 438/669; 438/704; 438/745; 438/749; 438/906
(58) Field of Search .................................... 438/622, 629, 438/648, 656, 618, 666, 667, 669, 672, 675, 685, 688, 704, 745, 749, 754, 906, 972

(56) References Cited

U.S. PATENT DOCUMENTS

| | | | |
|---|---|---|---|
| 6,077,762 | * 6/2000 | Liang et al. | 438/593 |
| 6,153,531 | * 10/2000 | Bothra et al. | 438/745 |

FOREIGN PATENT DOCUMENTS 50-036935 * 4/1975 (JP) .

* cited by examiner

Primary Examiner—Charles Bowers
Assistant Examiner—Thanhha Pham
(74) Attorney, Agent, or Firm—Jiawei Huang; J.C. Patents

(57) ABSTRACT

A method of protecting a tungsten plug from corroding. After a tungsten plug is formed in a substrate, a wire is formed on the substrate to couple with the tungsten plug. The substrate is dipped into an electrolyte solution. The electrolyte solution is acid or alkaline enough to discharge charges accumulated on the wire. Then, a wet cleaning process is performed to remove polymer formed on the wire.

14 Claims, 2 Drawing Sheets

METHOD OF PROTECTING TUNGSTEN PLUG FROM CORRODING

CROSS-REFERENCE TO RELATED APPLICATION

This application claims the priority benefit of Taiwan application serial no. 88107216, filed May 4, 1999, the full disclosure of which is incorporated herein by reference.

BACKGROUND OF THE INVENTION

1. Field of Invention

The present invention relates to a method for fabricating a semiconductor device. More particularly, the present invention relates to a method of protecting a corrosion of tungsten plug.

2. Description of Related Art

In general, after forming a tungsten plug, a wire is formed to couple with the tungsten plug. While performing an etching process to pattern the wire, polymer is formed on sides of the wire. A wet cleaning process is then performed with a stripping solution to remove the polymer.

FIG. 1 is a schematic, cross-sectional diagram illustrating a situation where a wire is aligned over a tungsten plug.

Referring to FIG. 1, a tungsten plug 120 is formed in a substrate 100, and a barrier layer 110 is formed between the substrate 100 and the tungsten plug 120. A patterned wire 130 is formed on the substrate 100. Normally, the wire 130 is aligned over the tungsten plug 120 and covers the entire tungsten plug 120. The wire 130 protects the tungsten plug 120 from corroding while the wet cleaning process is performed with the stripping solution to remove the polymer on the sides of the tungsten plug 120.

FIG. 2 is a schematic, cross-sectional diagram illustrating a situation where a wire is misaligned with a tungsten plug.

Referring to FIG. 2, a portion of the tungsten plug 120 is exposed when the wire 130 is misaligned over the tungsten plug 120. While the wet cleaning process is performed with a stripping solution to remove the polymer on the sides of the tungsten plug 120, the tungsten plug 120 is corroded by the stripping solution and a hole 140 is formed in the tungsten plug 120.

The occurrence of tungsten corrosion is caused by charges accumulated on the wire. While performing the etching process to form the wire 130, the charges are accumulated on the wire 130; thus, a great electrical potential is generated between the tungsten plug 120 and the wire 130. As a result, the exposed tungsten is oxidized to an ionic state such as $WO_4^{-2}$ by the stripping solution whose pH value is about 10 to about 12 and dissolved into the stripping solution during the wet cleaning process. Therefore, the hole 140 is formed.

In Bothra et al. (IEEE 98 CH36173.36 Annual International Reliability Physics Symposium, 1998. pp. 150–156), a method to avoid the occurrence of tungsten corrosion is provided. The substrate is dipped into a neutral ionic solution such as deionized water for several hours, and then the wet cleaning process is performed. By dipping the substrate into the neutral ionic solution, the charges accumulated on the wire are discharged; thus, the tungsten plug can be protected from corrosion during the wet cleaning process. However, although the tungsten plug is protected, the wire is corroded by being dipped into the neutral ionic solution. Another method is that the charges are discharged by an electron beam. However, an electron beam machine is not generally used in the manufacturing processes.

SUMMARY OF THE INVENTION

The invention provides a method of protecting a tungsten plug from corroding. By the method, an occurrence of tungsten corrosion is avoided during a wet cleaning process.

As embodied and broadly described herein, the invention provides a method of protecting a tungsten plug from corrosion. After a tungsten plug is formed in a substrate, a wire is then formed on the tungsten plug over the substrate. The substrate is dipped into an electrolyte solution. Then, a wet cleaning process is performed to remove polymer formed on the wire.

In the invention, the substrate is only dipped into the electrolyte solution for a short time interval. Then, the charges accumulated on the wire are discharged. As a result, the occurrence of tungsten corrosion is avoided while the subsequent wet cleaning process is performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
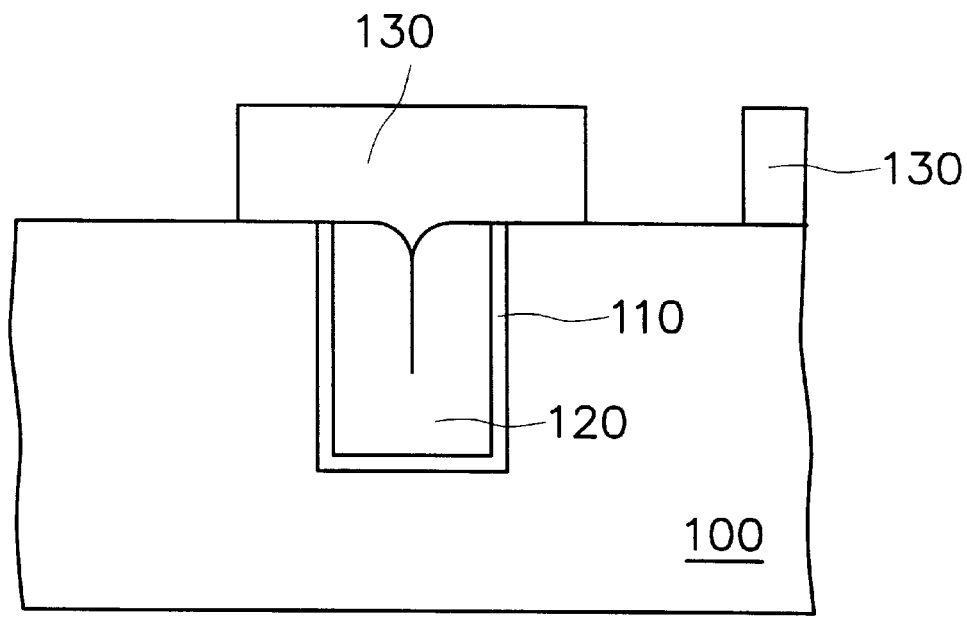
FIG. 1 is a schematic, cross-sectional diagram illustrating a situation where a wire is aligned with a tungsten plug.
Figure 2:
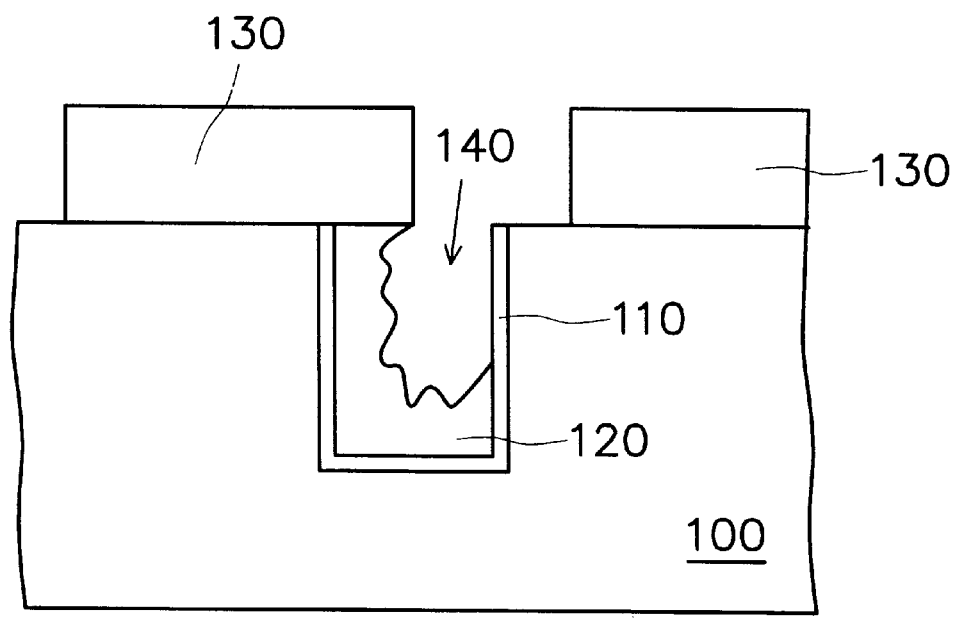
FIG. 2 is a schematic, cross-sectional diagrams illustrating a situation where a wire is misaligned with a tungsten plug.
Figure 3A:
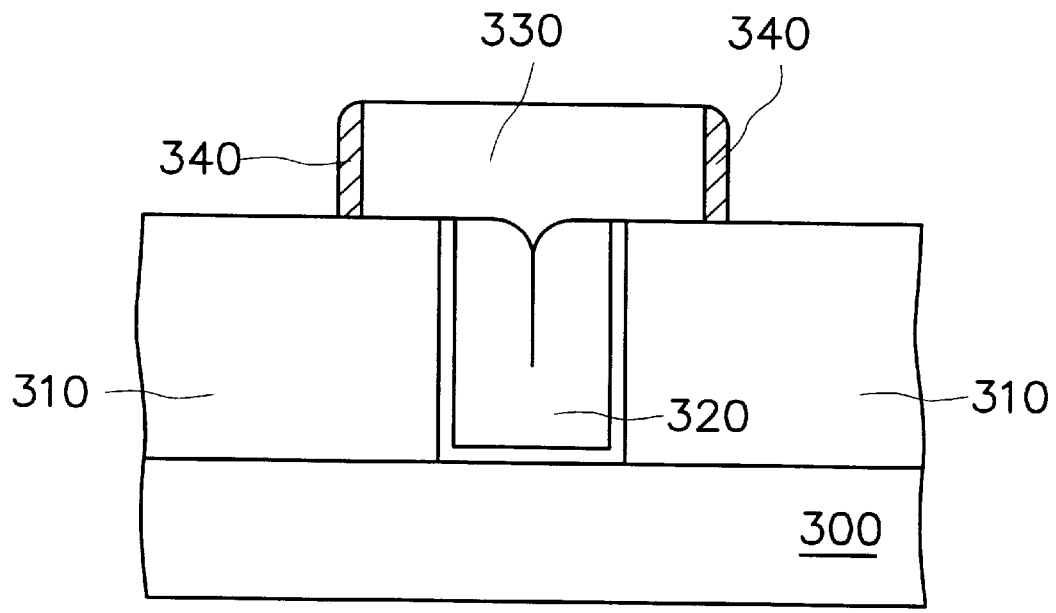
FIGS. 3A through 3B are schematic, cross-sectional diagrams illustrating a method of protecting a tungsten plug from corrosion according to the invention.
Figure 3B:
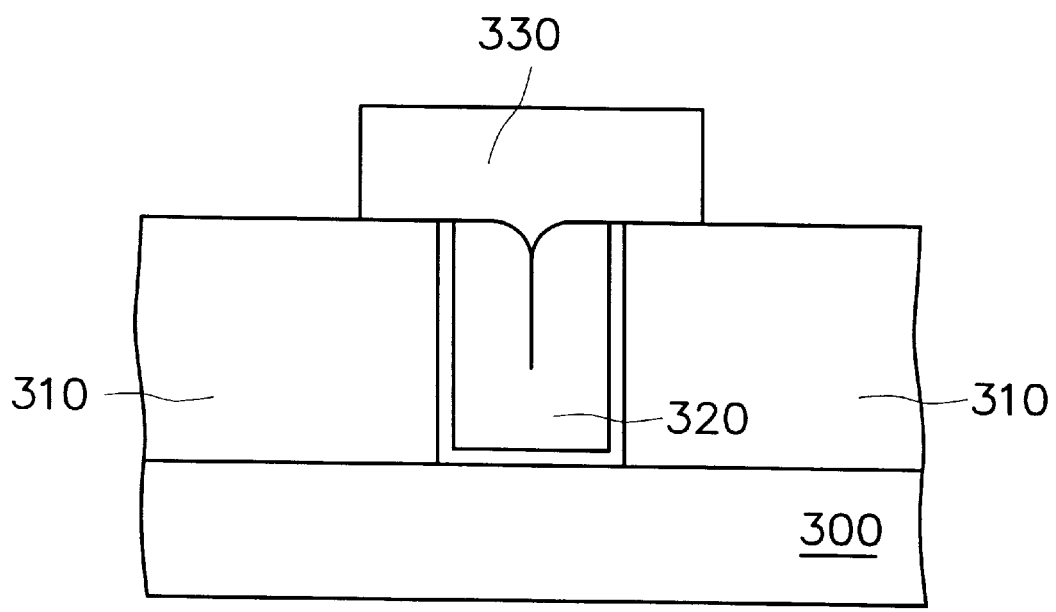

FIGS. 3A through 3B are schematic, cross-sectional diagrams illustrating a method of protecting a tungsten plug from corrosion according to the invention.

Referring to FIG. 3A, a metal plug 320 is formed in a dielectric layer 310 on a substrate 300. The metal plug includes tungsten and is preferably formed by chemical vapor deposition. A metal layer is formed on the dielectric layer 310 and on the metal plug by sputtering or chemical vapor deposition; the metal layer includes aluminum or copper. Then, the metal layer is etched to form a wire 330. When the metal layer is made of aluminum, the metal layer is etched by plasma contains chlorine ($Cl_2$), boron trichloride ($BCl_3$), carbon tetraflouride ($CF_4$) or trifluoro methane ($CHF_3$). After the etching step, polymer 340 is formed on a sidewall of the wire 330.

Then, the substrate 300 is dipped into an electrolyte Solution at a temperature for a time interval, that the electrolyte solution should be sufficiently acid or sufficiently alkaline. Charges accumulated on the wire can be discharged by dipping the substrate into the electrolyte solution. The polymer 340 is then removed by using a cleaning solution as show n in FIG. 3B.

Preferably, when an acid electrolyte solution is used, the pH value of the acid electrolyte solution is less than 6.5. The acid electrolyte solution includes an oxy-acid aqueous solution such as acetic acid ($CH_3COOH$), sulfuric acid ($H_2SO_4$) or nitric acid ($HNO_3$). The acid electrolytic solution further includes a hydrohalic acid like hydrofluoric acid (HF) or hydrochloric acid (HCl). An acid salt aqueous solution, for example, sodium hydrogen sulfate ($NaHSO_4$), ammonium chloride ($NH_4Cl$) or ammonium nitride ($NH_4NO_3$) is also suitable.

Preferably, when an alkaline electrolyte solution is used, the pH value of the alkaline electrolyte solution is greater than 7.5. The alkaline electrolyte solution includes either ammonium hydroxide ($NH_4OH$) aqueous solution or metal hydroxide ($M(OH)_x$) aqueous solution. The metal hydroxide aqueous solution includes sodium hydroxide (NaOH) or potassium hydroxide (KOH). An alkaline salt aqueous solution, for example, sodium acetate ($CH_3COONa$) or sodium carbonate ($Na_2CO_3$) is also suitable.

The temperature and the time interval are determined according to the electrolyte solution selected. For example, when a potassium hydroxide aqueous solution is used, the time interval is about 10 seconds to about 120 seconds, and the temperate is about 10 degree Celsius (° C.) to about 30 degree Celsius (° C.). Additionally, weight percentage of the electrolyte solution is determined according to solubility of the electrolyte. For example, the weight percentage of potassium hydroxide is about 0.0005% to about 0.5% because potassium hydroxide can be fully dissociated into $K^+$ and $OH^-$. However, the weight percentage of ammonium hydroxide is from about 0.5% to about 3% due to the poor solubility of ammonium hydroxide, so that there should be sufficient ions in the electrolyte solution. Therefore, the charges accumulated on the wire are discharged to protect the tungsten plug from corrosion.

In the invention, the substrate is only dipped into the electrolyte solution for a short time interval, during which the charges accumulated on the wire are discharged. As a result, the occurrence of tungsten corrosion is avoided when the subsequent wet cleaning process is performed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of protecting a tungsten plug from corroding, the tungsten plug being formed in a substrate and coupled with a wire formed on the substrate, the method comprising the steps of:

dipping the substrate inton alkaline electrolyte solution, the alkaline electrolyte solution being sufficiently alkaline to discharge charges accumulated on the wire; and performing a wet cleaning process to clean a surface of the wire.

2. The method of claim 1, wherein a pH value of the alkaline electrolyte solution is greater than 7.5.

3. The method of claim 1, wherein the alkaline electrolyte solution includes an ammonium hydroxide aqueous solution.

4. The method of claim 3, wherein weight percentage of ammonium hydroxide is about 0.5% to about 3%.

5. The method of claim 1, wherein the alkaline electrolyte solution includes a metal hydroxide aqueous solution.

6. The method of claim 5, wherein the metal hydroxide aqueous solution includes a potassium hydroxide aqueous solution.

7. The method of claim 6, wherein weight percentage of potassium hydroxide is about 0.0005% to about 0.5%.

8. The method of claim 6, wherein the temperature of the solution is from about 10 degrees Celsius to 30 degrees Celsius.

9. The method of claim 6, wherein the dipping of the substrate is performed for a time interval of about 10 seconds to about 120 seconds.

10. The method of claim 1, wherein the alkaline electrolyte solution includes an alkaline salt aqueous solution.

11. The method of claim 10, wherein the alkaline salt includes sodium acetate.

12. The method of claim 10, wherein the alkaline salt includes sodium carbonate.

13. A method of forming a wire to couple with and to cover at least a portion of a tungsten plug in a substrate, the method comprising:

forming a metallic layer on the tungsten plug;

patterning the metallic layer to form the wire, wherein polymer residues are formed on sides of the formed wire;

dipping the substrate into an alkaline electrolyte solution to discharges accummulated on the wire for protecting the tungsten plug from corroding; and removing the polymer residues.

14. The method of claim 13, wherein the electrolyte solution has a pH value higher than 7.5 to discharge charges accumulated on the wire.

* * * * *